United States Patent [19]
Torkington et al.

[11] Patent Number: 5,160,903
[45] Date of Patent: Nov. 3, 1992

[54] HIGH ISOLATION PACKAGING TECHNOLOGY

[75] Inventors: Richard S. Torkington, Mesa; David G. Lamoreaux, Tempe, both of Ariz.

[73] Assignee: Motorola, Inc., Schaumburg, Ill.

[21] Appl. No.: 620,878

[22] Filed: Dec. 3, 1990

[51] Int. Cl.⁵ .............................................. H05K 9/00
[52] U.S. Cl. .................................... 333/12; 174/35 R; 361/424; 333/246
[58] Field of Search ............... 333/12, 246, 247; 174/35 R; 361/424

[56] References Cited

U.S. PATENT DOCUMENTS

| | | | |
|---|---|---|---|
| 4,370,515 | 1/1983 | Donaldson | 174/35 R |
| 4,622,527 | 11/1986 | Carlson | 361/424 X |
| 4,648,128 | 3/1987 | Saka et al. | 361/424 X |
| 4,861,941 | 8/1989 | Kubo et al. | 174/35 R |

FOREIGN PATENT DOCUMENTS

| | | | |
|---|---|---|---|
| 2629053 | 1/1978 | Fed. Rep. of Germany | 361/399 |
| 27797 | 1/1990 | Japan | 174/35 R |
| 177499 | 7/1990 | Japan | 174/35 R |
| 2101811 | 1/1983 | United Kingdom | 174/35 R |

*Primary Examiner*—Paul Gensler
*Attorney, Agent, or Firm*—Jeffrey D. Nehr

[57] ABSTRACT

A microwave circuit high isolation packaging technology involving the fabrication of a single-piece baseplate containing microwave circuits, the fabrication of a single-piece framework, and the assembly of the baseplate structure to the framework structure eliminating any gaps. The baseplate contains the desired microwave circuitry without isolation channels or other impediments to mounting circuit components or making circuit interconnections. The framework comprises all isolation walls, transoms, or other structures capable of isolating individual portions of the microwave circuit when assembled to the baseplate.

9 Claims, 3 Drawing Sheets

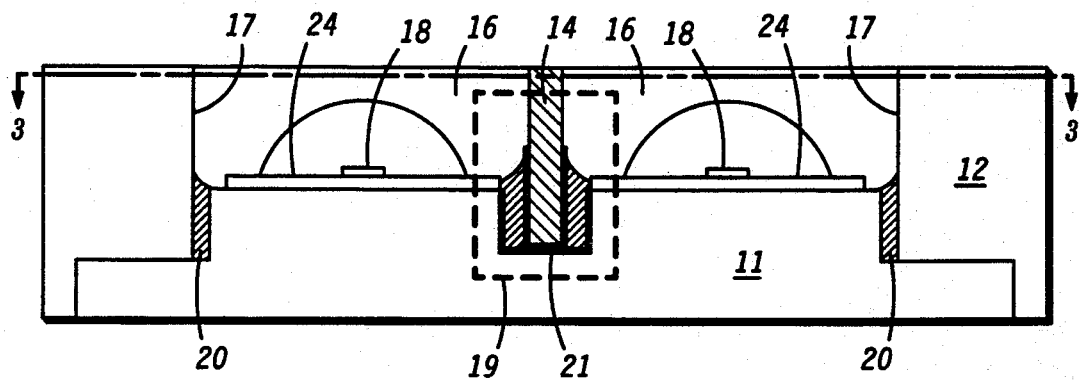
FIG. 1
FIG. 4
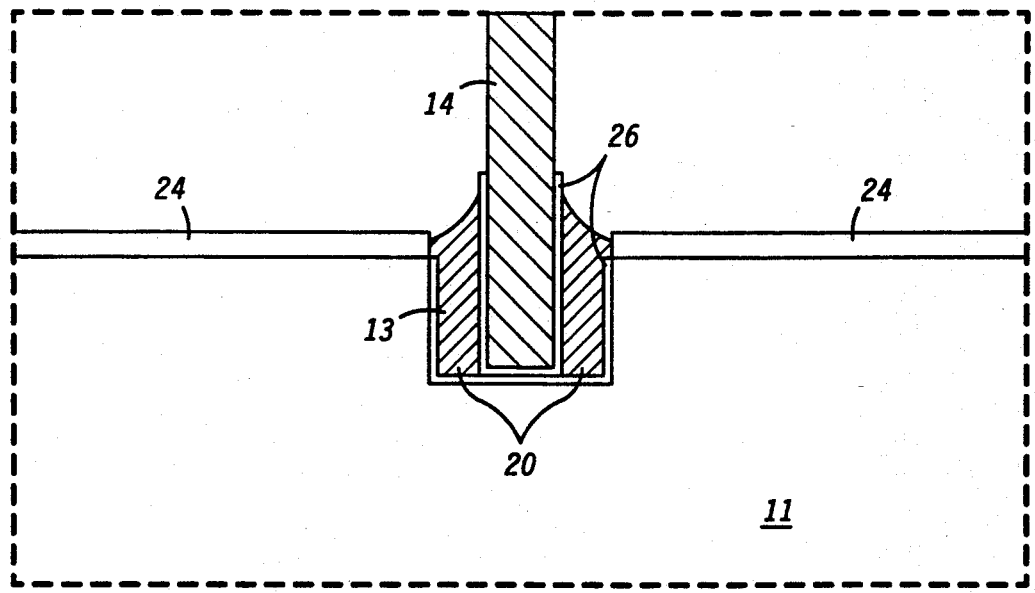

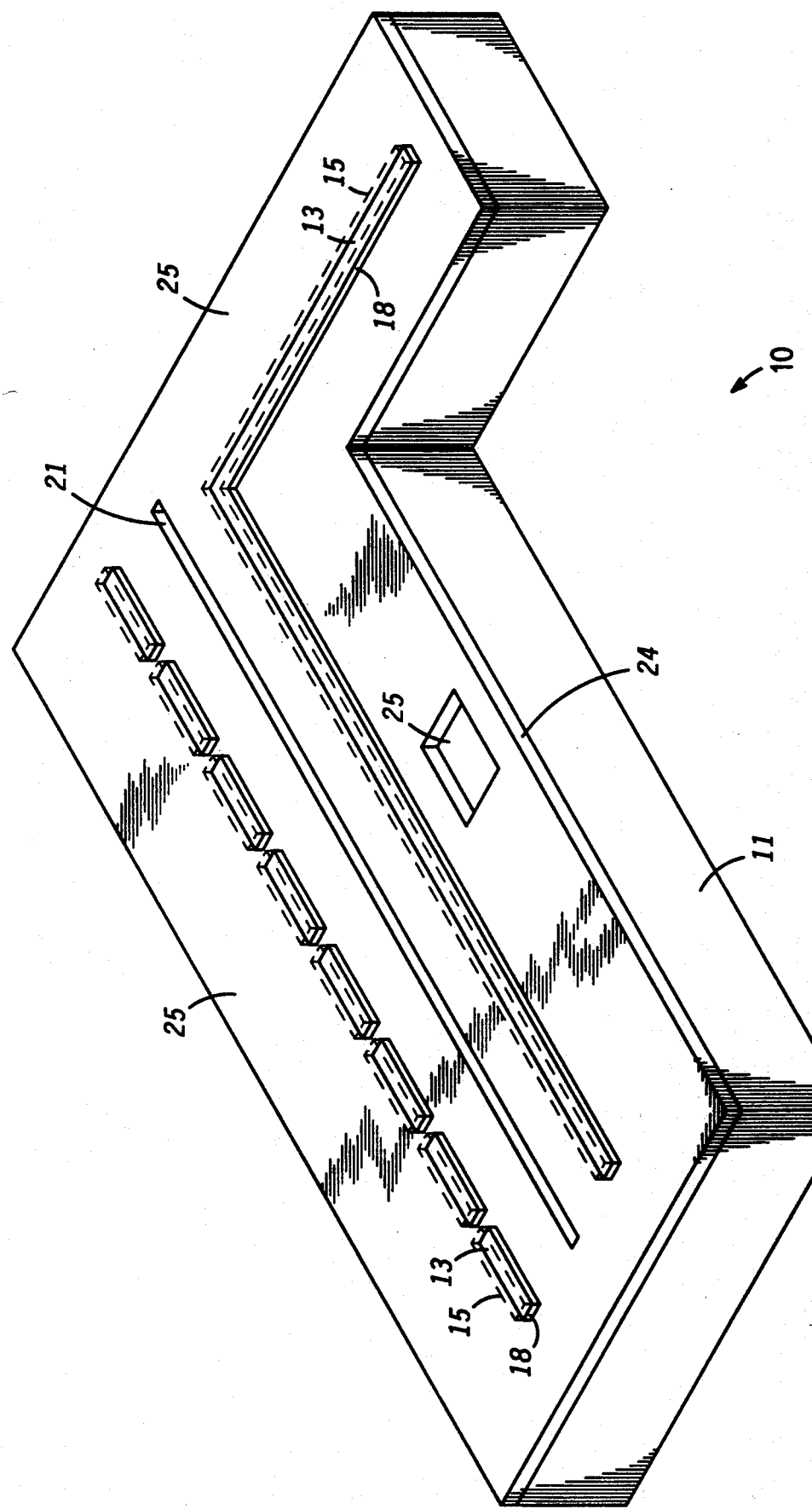

HIGH ISOLATION PACKAGING TECHNOLOGY

BACKGROUND OF THE INVENTION

This invention relates in general to the field of electronics packaging, and in particular to microwave circuitry packaging to meet stringent microwave signal isolation requirements.

Microstrip circuit boards are typically used to provide signal paths at microwave frequencies. Enclosures with no gaps or very small gaps are required to provide isolation between microwave signals in nearby portions of microwave circuits. The smaller the gap size in the microwave circuit enclosure, the higher the microwave signal isolation. Low frequencies, on the order of 100 MegaHertz (MHz), are relatively easy to isolate. High frequency microwave signals for which a high isolation packaging technology is especially desirable can be on the order of 10-20 GigaHertz (GHz).

A traditional approach to provide the necessary microwave signal isolation microwave circuitry is to end mill isolated channels into a relatively thick metallic plate as a base, and then to install microwave components, microstrip circuitry, and the associated electrical interconnections in the desired circuit configuration before fitting a cover onto the package. This approach totally encloses the microstrip circuitry in each covered channel, but leaves wall edges of the milled channels which typically need to be fitted with gaskets to fill gaps where the channels meet the cover of the enclosure. This covered channel approach has several shortcomings, including:

a) separate microstrip segments need to be individually trimmed, positioned, and bonded, which is labor-intensive, and, therefore, an expensive, time-consuming process;

b) quality of the installation is hard to ensure based on the poor access to many areas within the channels, yet the individual trimming, positioning, and bonding provide a high possibility of error; a significant amount of rework can be required for the traditional microstrip enclosures.

c) gaskets for the wall edges take a significant amount of time to install, and can be pinched during assembly of the microstrip enclosure; a pinched gasket can leave a gap in the enclosure and fail to provide isolation for the adjacent microstrip circuitry;

d) milled channels provide poor access to many areas within the channels for assembly operations including wirebonding, soldering, and parallel-gap welding; the installation of components and assembly of the package is thereby slowed, increasing costs;

Thus, what is needed is a method for providing high isolation of microwave signals on microstrip circuitry while decreasing assembly time and difficulty, and increasing microwave signal isolation in a low-cost package.

SUMMARY OF THE INVENTION

Accordingly, it is an advantage of the present invention to provide a low-cost method for providing a technology to provide high isolation of microwave signals on microstrip circuitry. It is also an advantage to reduce assembly time and difficulty of the microwave circuit isolation package. Finally, it is an advantage of the invention to increase the isolation capability of the microwave circuit packaging by providing for gap-free enclosure of microstrip circuitry.

To achieve these advantages, a microwave circuit high isolation packaging technology is contemplated which involves fabricating a single-piece baseplate containing the microwave circuits, fabricating a single-piece framework, where the framework comprises isolation walls, transoms, or other structures capable of isolating individual portions of the microwave circuit when mated with the baseplate, and assembling the baseplate and the framework to provide microwave signal isolation by eliminating the gaps between the baseplate and framework.

The above and other features and advantages of the present invention will be better understood from the following detailed description taken in conjunction with the accompanying drawings.

BRIEF DESCRIPTION OF THE DRAWINGS

In FIG. 1, there is shown a cross-sectional diagram of a microwave circuit high isolation package in accordance with the present invention.

FIG. 2 is an isometric view of the high isolation package after masking of the microwave circuitry and machining away unmasked laminate or baseplate.

FIG. 4 is an enlargement of area 19 of FIG. 1, showing additional detail in the region of isolation wall and baseplate interconnection of the high isolation package.

DETAILED DESCRIPTION OF THE PREFERRED EMBODIMENT

Figure 3:
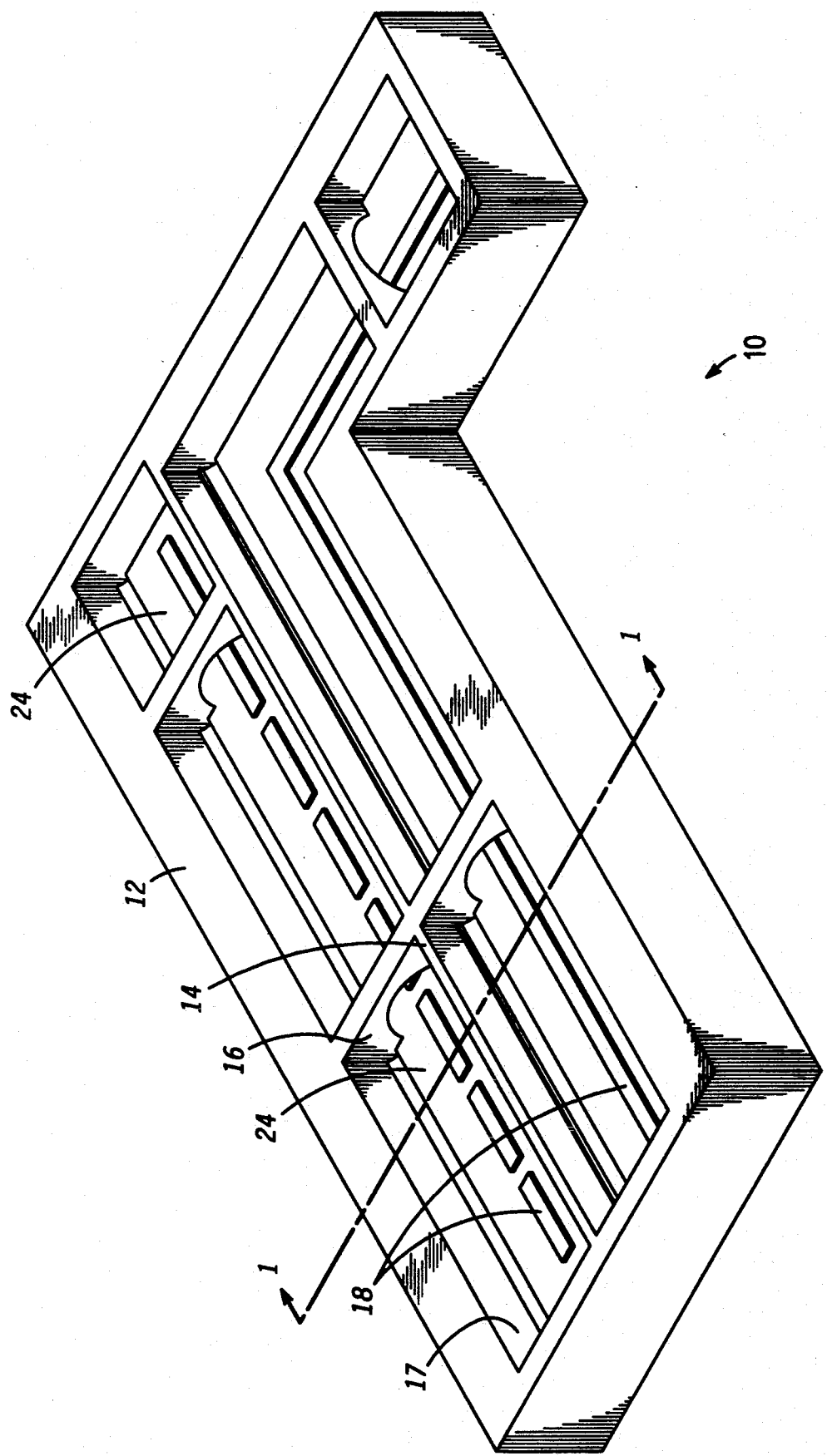
FIG. 3 is an isometric view of the high isolation package in the direction and below the plane indicated by line 3—3 in FIG. 1. Note that FIG. 1 is the cross-sectional view of the high isolation package at the location and in the direction indicated by line 1—1 in FIG. 3.

In FIG. 1, there is shown a cross-section of a microwave circuit high isolation package 10 comprising a baseplate 11 of material to which a lamination of a dielectric substrate 24 has been added. The layer of dielectric substrate 24 can be composite powder pressed under heat to create a monolithic layer approximately twenty-five thousandths of an inch (0.025 in.) thick. The composite powder can be a powder sold under the trademark TEFLON. Pressed on the surface of the dielectric substrate 24 opposite the baseplate 11, can be a layer of conductive material 18. The conductive material can be copper of a thickness appropriate to serve as a microstrip conductor for microwave signals of the desired frequency. The two layers on the baseplate comprise circuit board material from which the microwave microstrip circuit will be made. Mated to the baseplate structure 11 is a framework structure 12, comprised of framework edges 17, transoms 16, and isolation wall 14. The isolation wall 14 fits within baseplate channel 21. All the gaps at which the framework 12 and baseplate 11 meet are filled with solder 20.

The microstrip circuit board material referred to above that is pre-laminated to a structural baseplate is commercially available. An example is an aluminum baseplate 11 to which a composite layer 24 can be laminated, over which can be laminated a layer of copper 18. Such a material is available from Rogers Corporation Chandler, Arizona, as RT duroid 58XX, 60XX, or TMMXX, for instance. Selection of specific printed circuit board material is based on desired electrical properties and application. The thickness of the aluminum portion of the baseplate 11 is a structural consideration, based on the desired structural properties of the final package 10.

As shown in FIG. 2, circuitry pattern 13 for an entire microwave circuit module can be achieved through a number of additive or subtractive photo processes; for example, the circuit can be etched directly onto the copper surface 18. Following circuit fabrication, the copper 18 comprising the pattern of the desired microwave circuitry can be protected from subsequent handling and subsequent plating operations by the use of, for example, a liquid, air-curing masking 15. Selected portions 25 of the circuit board material and/or the baseplate 11 can then be removed as desired, e.g. by machining, to expose the ground plane (aluminum lamination, i.e. the baseplate, 11) for component mounting, and/or to create wall channels, e.g. 21, for attachment of isolation wall 14, and/or to create mounting planes, e.g. 25, for other module construction. The exposed metal, e.g. 21 and 25, can then be plated for solderability (for example, with electroless nickel, copper, and 95-5tin-lead) before the masking 15 is removed.

After the masking 15 is removed, the most prominent surface of the module contains the desired microwave circuitry, comprised of unremoved copper 18. The copper circuit 18 is readily accessible, since it is not located in an isolation channel, and is free of impediments to mounting components or making interconnections. Since the isolation structures in FIGS. 3–4, such as isolation 14 and wall transom 16, are all integral parts of the framework 12 to be added to the baseplate 11 structure after any additional circuit work is performed, there are no isolation structures with which to contend in working with the circuit 18.

Since the circuit 18 is fabricated in one piece, the costly steps of documenting, procuring, inspecting, trimming, and bonding a large number of separate microstrip segments can be eliminated. All positioning and tolerancing of the microwave circuit 18 can be performed at the artwork level, significantly increasing the likelihood of producing a properly functioning circuit and lessening the likelihood of the need for rework. This approach also provides the capability to produce complicated microwave circuits, since positioning and tolerancing of individual components becomes overly tedious and burdensome for even modestly-complex microwave circuits. Microstrip filters and couplers can be designed as an integral part of the module circuit board artwork 13, reducing the number of interconnects for the circuit 18 needed to be added later.

As shown in FIG. 3, a one-piece framework 12 comprises isolation walls 14 and transom 16. The one-piece framework 12 can be designed to mate with the baseplate 11 to enclose each section of microwave circuitry 18 desired to be isolated. Critical to this design is the use of the transom 16, which is integral with the framework 12. The transom 16 structurally connects neighboring isolation structures such as isolation wall 14 and framework edge 17 by spanning the microwave signal path 18 without significantly interacting with the microwave electromagnetic transmission field. The use of the transom 16 permits the one-piece fabrication of the isolation wall framework 12, enhancing accurate alignment with the structural baseplate 11 with which the transom 16 mates. Use of the transom 16 also permits the design of the isolalation wall framework 12 as a structural element, which can be tailored to evenly distribute mechanical stresses in the microwave circuit high isolation package 10 as required. After fabrication, exposed metal on the framework 12 can be plated for solderability (for example, with electroless nickel, copper, and 95-5 tin-lead) before assembly with the baseplate structure.

Before assembly of the baseplate 11 structure to the framework 12, additional components, e.g., hybrid devices, chip components, unpackaged semiconductor die, etc. can be placed on the baseplate 11 and necessary interconnections made. Components mountable with solder can be placed at this point using, for example, solder paste or preform 20. Similarly, solder paste or preform 20 can be applied to the isolation wall 14 mounting site. The framework 12 can then be mechanically assembled to the baseplate 11.

FIG. 4 shows the detail 19 shown in FIG. 1 of the framework wall 14 with plating 26 attached with solder 20 to the channel 21 of baseplate 11 which has also been plated with plating 26. The one-piece isolation wall 14 structure of the framework 12 is amenable to self-fixtured soldering designed to follow mechanical assembly of the baseplate 11 structure to the framework 12. The use of solder 20 instead of a gasket to fill the gap between the baseplate 11 structure and the framework 12 structure creates superior microwave isolation between adjacent microwave signal paths 18, particularly where electromagnetic fields are strong. Soldering application can be by silkscreen, paste, solder ribbon, or other methods. The solder paste, preform, etc. 20 can be reflowed by machine soldering methods such as 215 degree Celsius vapor phase soldering with the high isolation package in place. Following baseplate 11 structure soldering to the framework 12, additional components, e.g., hybrid devices, chip components, unpackaged semiconductor die, etc., can be installed as required.

A high isolation packaging technology has been described which overcomes specific problems and accomplishes certain advantages relative to prior art mechanisms. The failure of a gasket to provide a gapless enclosure because of pinching during assembly is precluded because the high isolation packaging technology does not employ gaskets. Access to the microwave circuit for assembly operations, including wirebonding, soldering and parallel-gap welding is far better than for covered milled channel designs because of the prominence of the circuit compared to the surrounding surfaces. The individual trimming, positioning, and bonding required for completing the microwave circuit traditionally is reduced by printing the circuitry artwork in one step. The one-step printing of the circuitry is also advantageous for complex microwave circuits which cannot easily be assembled by hand. The printing, masking, and machining method additionally enables the achievement of better position tolerances and the printing of microwave couplers and filters as an integral portion of the circuit. Finally, the use of solder to form a gapless enclosure surrounding microwave signal paths provides a very high degree of microwave signal isolation of neighboring portions of microwave circuits.

Thus, there has been provided, in accordance with an embodiment of the invention, a microwave circuit high isolation packaging technology that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

We claim:

1. A gap-less package to provide isolation between signals on microstrip circuitry at microwave frequencies without gaskets, the package comprising:
   a single-piece baseplate of metal with at least one channel the baseplate including printed microwave circuitry laminated to microstrip board material;
   a single-diece framework, wherein the framework comprises at least one isolation structure mating to the at least one channel the at least one isolation structure for electromagnetically isolating at least one of the printed microwave circuitry; and
   solder coupling the baseplate to the framework.

2. A package as recited in claim 1 wherein the baseplate further comprises
   printed microwave circuitry laminated to the microstrip circuit board material; and
   plating on a surface of the at least one channel.

3. A package as recited in claim 2 wherein the at least one isolation structure comprises:
   a plurality of isolation walls;
   a plurality of transoms coupled to the plurality of isolation walls; and
   plating on portions of the plurality of isolation walls immediately adjacent to the baseplate.

4. A gap-less package without gaskets for providing isolation between signals on microstrip circuitry at microwave frequencies, the package comprising:
   a substantially planar single-piece baseplate comprising opposite first and second planar surfaces, the baseplate including a plurality of channels in the first planar surface with a plurality of channel surfaces below the first planar surface;
   a plurality of microstrip circuitry mounted on the first planar surface of the baseplate;
   a single-piece framework comprising a plurality of isolation structures for electromagnetically isolating the plurality of microstrip circuitry; and
   solder coupling both the framework to the baseplate and the plurality of isolation structures to the plurality of channel surfaces.

5. A package as recited in claim 4, wherein the plurality of microstrip circuitry comprises:
   a plurality of printed microwave circuitry elements, wherein the printed microwave circuitry elements are substantially planar in a first layer;
   microstrip circuit board material comprising a second layer, wherein the second layer is laminated to the first layer; and
   metal comprising a third layer, wherein the third layer is laminated to the second layer opposite to the first layer.

6. A package as recited in claim 5 wherein the framework comprises metal.

7. A package as recited in claim 6 wherein the plurality of isolation structures further comprises:
   a plurality of isolation walls; and
   a plurality of transoms coupled to the plurality of isolation walls.

8. A package as recited in claim 7, wherein the framework further comprises plating on portions of the plurality of isolation walls immediately adjacent to the baseplate.

9. A package as recited in claim 8 wherein the plurality of channels comprise plating on the plurality of channel surfaces.

* * * * *